United States Patent [19]

Okikawa et al.

[11] 4,100,566

[45] Jul. 11, 1978

[54] RESIN-SEALED TYPE SEMICONDUCTOR DEVICES AND MANUFACTURING METHOD OF THE SAME

[75] Inventors: Susumu Okikawa, Ohme; Hiroshi Mikino, Tachikawa, both of Japan

[73] Assignee: Hitachi, Ltd., Japan

[21] Appl. No.: 780,327

[22] Filed: Mar. 23, 1977

[30] Foreign Application Priority Data

Mar. 24, 1976 [JP] Japan ................................. 51-31249
Mar. 24, 1976 [JP] Japan ................................. 51-31250
May 28, 1976 [JP] Japan ................................. 51-61171

[51] Int. Cl.² ..................... H01L 23/48; H01L 29/44; H01L 29/52
[52] U.S. Cl. ........................................ 357/70; 357/72; 357/74; 357/79; 357/81; 29/588; 29/588
[58] Field of Search ..................... 357/72, 74, 79, 81, 357/80; 29/588, 589

[56] References Cited

U.S. PATENT DOCUMENTS

| | | | |
|---|---|---|---|
| 3,423,516 | 1/1969 | Segerson | 357/72 |
| 3,539,875 | 11/1970 | Fong et al. | 357/74 |
| 3,562,404 | 2/1971 | Satriano | 357/72 |
| 3,654,695 | 4/1972 | Del Gaudio | 357/72 |
| 3,679,946 | 7/1972 | Buck et al. | 357/72 |
| 3,729,573 | 4/1973 | Dunn | 357/72 |
| 3,754,169 | 8/1973 | Lyon et al. | 357/72 |

*Primary Examiner*—Andrew J. James
*Attorney, Agent, or Firm*—Craig & Antonelli

[57] ABSTRACT

When a resin-sealed type semiconductor device having a heat dissipating plate is mounted on a mounting plate by means of screws or the like, means are provided to prevent occurrence of cracks in the resin sealing portion and semiconductor circuit elements embodied therein. To this end, the resin body, heat dissipating plate or mounting plate is thickened at portions thereof where screw receiving apertures are formed. Alternatively, washer or the like member may be employed.

16 Claims, 16 Drawing Figures

RESIN-SEALED TYPE SEMICONDUCTOR DEVICES AND MANUFACTURING METHOD OF THE SAME

BACKGROUND OF THE INVENTION

1. Field of the Invention

The present invention relates to a resin-sealed semiconductor device and in particular to a high power semiconductor device of the resin-sealed type having a heat dissipation plate provided at a lower surface of a resin-sealing portion.

2. Description of the Prior Art

As is well known, in the case of the power semiconductor devices and the power integrated circuit devices (power IC's), a large amount of heat is generated because of the large power consumption during use thereof. Since the semiconductor devices are likely to vary electric characteristic under the influence of heat, it is necessary to dissipate heat as rapidly as possible.

Heretofore, there has been known a power IC of the structure shown in FIG. 1 which is so constructed as to dissipate rapidly the heat generated in semiconductor elements. Referring to the figure, the power IC denoted generally by reference numeral 1 comprises a planar heat dissipating plate 2 of copper on which semiconductor elements are mounted. A plurality of leads 3 arrayed substantially in parallel to one another are provided above the plate 2 and connected to the associated semiconductor elements at the inner ends by means of wires or the like. The upper portion of the heat dissipating plate 2 is coated with a resin material. In other words, the inner end portions of the leads 3, the connecting wires and the semiconductor elements are covered by a resin-sealing portion 4. However, at least the lower surface 5 of the heat dissipating plate 2 is exposed as shown in FIG. 1. It is to be noted that the power IC 1 is shown as upset in FIG. 1. so that the lower surface 5 of the heat dissipating plate 5 may be observed clearly. The heat dissipating plate 2 as well as the resin-sealing portion 4 are formed with notches 6 adapted to receive set screws at both ends thereof.

The hitherto known power IC of the structure described above suffers from drawbacks that cracks are frequently produced at a center portion of the upper surface of the resin-sealing portion and in an extreme case even the semiconductor elements in the resin-sealing portion are damaged or cracked, when the power IC is mounted on a mounting plate by means of the clamping screws.

From examinations to clear up the causes of such undesirable phenomena, a following fact has been found. Namely, when the resin-sealing portion is formed during the fabrication process of the power IC, the sealing is carried out at a high temperature, which is subsequently decreased to room temperature. At that time, a warp or bending will occur in the resin layer due to difference in thermal contraction between the heat dissipating plate and the resin layer and additionally due to the setting contraction of the resin when the temperature is lowered. In more particular, the thermal expansion coefficient of the heat dissipating plate of copper is $17 \times 10^{-6}/° C$ which is very much smaller than that of the resin. The latter has usually a very large thermal expansion coefficient on the order of $30 \times 10^{-6}/° C$, for example. For this reason, the resin portion is subjected to a great contraction after the sealing, which gives rise to the warp or bending of the resin layer. Assuming by way of example that the resin layer has width of 10 mm, length of 30 mm and thickness of about 5 mm, while the heat dissipating plate is formed of a copper plate of 1 to 1.5 mm thick with the width and the length being substantially equal to those of the sealing portion or slightly smaller than the latter, the warp $a$ (FIG. 2) produced in the resin layer will amount to about 0.2 mm as measured at the end portions of the resin layer.

Such being the circumstances, when the power IC having the warped resin-sealing portion is to be secured onto the mounting plate 9 at both ends by means of the clamping screws 7 and nuts 8, a great tensil stress will be produced in the resin-sealing portion adjacent to the upper surface thereof. When the tensile stress exceeds the tensile strength strain of the resin on the order of $4000 \times 10^{-6}$, cracks 10 will be produced, resulting in a reduced moisture resistance of the power IC. Besides, when the warp is of a greater magnitude, then the semiconductor elements embedded in the resin-sealing portion will be also damaged, resulting in a deterioration in the electric characteristics thereof and eventually non-usability.

In connection with the above discussion, it is conceivable that the sealing portion is bent along the edge portions thereof when the sealed product is taken out of a defective sealing mold. Such a bend will of course provide a cause for cracks in the upper surface of the sealing portion, etc.

SUMMARY OF THE INVENTION

An object of the invention is to provide a method and a structure for mounting a semiconductor device incorporating a heat dissipating plate having a remarkably higher thermal expansion coefficient than a resin-sealing portion fixedly and closely onto a mounting plate by means of screws without incurring any damge to the resin-sealing portion and semiconductor elements.

With the above object in view, the invention proposes to form protrusions in the resin-sealing portion on the vicinity of the screw receiving notches or insert a suitable member such as a washer between the mounting panel and the lower surface of the power IC thereby to minimize deformation in the direction opposite to the warping direction of the resin-sealing portion, which deformation is produced by the clamping force of the screw. The tensile stress produced in the resin-sealing portion adjacent to the upper surface thereof at the time of mounting the power IC can thus be reduced to a value smaller than the tensile strength, whereby production of cracks in the resin-sealing portion and the semiconductor elements can be positively prevented.

DETAILED DESCRIPTION OF THE PREFERRED EMBODIMENTS

Figure 1:
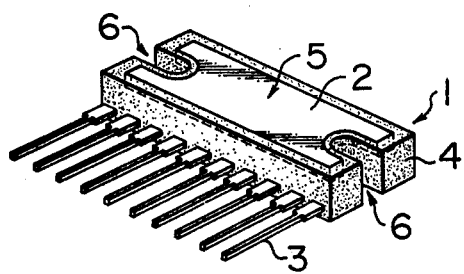
FIG. 1 is a perspective view showing the underside of a hitherto known resin-sealed power IC.
Figure 2:
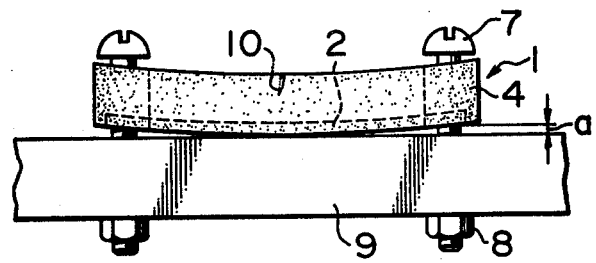
FIG. 2 shows the same in a state mounted on a mounting plate.
Figure 3:
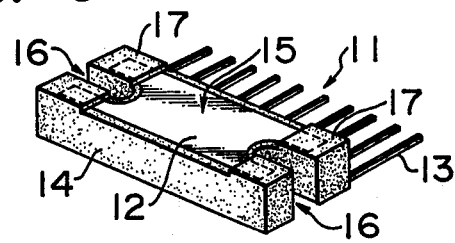
FIG. 3 is a perspective view showing a semiconductor device (power IC) according to an embodiment of the invention.

Referring to FIG. 3 which shows a semiconductor device according to an embodiment of the invention, the semiconductor device (power IC) denoted generally by reference numeral 11 comprises a heat dissipating plate 12 of copper on which semiconductor elements are mounted. A plurality of lead terminals 13 extending substantially in parallel with one another are provided above the heat dissipating plate 12 and have inner ends electrically connected by wires. The heat dissipating plate 12 is coated with a resin layer on the upper surface thereof. In this manner, the inner ends of the leads 13, the connecting wires and the semiconductor elements are covered by a resin-sealing portion 14. However, it is noted that at least the lower surface 15 of the heat dissipating plate 12 is exposed as can be seen from FIG. 3 which shows the semiconductor device in the upset state with a view to clearly showing the lower surface 15 of the heat dissipating plate 12. The plate 12 and the resin-sealing portion 14 are formed with notches 16 for receiving the clamping screws. According to the teaching of the invention, projections or protrusions 17 having a thickness in a range of 0.1 mm to 0.15 mm depending on the types of resins as used are formed at both end portions of the exposed surface of the heat dissipating plate 12 in the vicinity of the screw receiving notches 16. The dimension or height of the projections 17 is varied in dependence on the size of the power IC, material and dimension of the heat dissipating plate. Since the warp is about 0.2 mm at both ends of the power IC in the case of the example described hereinbefore in conjunction with FIG. 2, the height of the projections 17 in this embodiment has been selected at a value of 0.1 to 0.15 mm.

Figure 4:
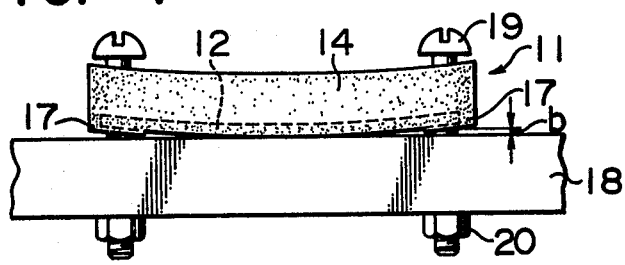
FIG. 4 shows the same in the state mounted on a mounting plate.

FIG. 4 illustrates the mounting of such power IC 11 on a mounting plate 18. Clamping screws 19 are inserted through the notches 16 with the tips there of also inserted through through-holes formed in the mounting panel 18. By means of nuts 20 and the screws 19, the power IC is fixedly secured to the mounting plate 18. In this connection, it will be noted that, even if the resin-sealing portion 14 should be subjected to a warp or bend of 0.2 mm as measured at both ends of the power IC, strain b of the resin-sealing portion in the direction opposite to that of the warp can be suppressed to a value smaller than 0.05 to 0.1 mm as measured at both end, of the power IC 11 due to the presence of the projections 17 of 0.1 to 0.15 mm thick, as is shown in FIG. 4. In this manner, distortion or deformation of the power IC caused by the mounting thereof on the panel cam be significantly reduced as compared with the case of the hitherto known semiconductor device. Thus, the resin-sealing portion 14 as well as semiconductor elements can be safely protected from any damage such as cracks.

Since the height of the projection 17 is selected so as to be smaller than the warp of the power IC, a major portion of the exposed lower surface of the heat dissipating plate can be closely contacted with the mounting plate through the clamping by means of the screws, assuring a satisfactory heat dissipation.

The height of the projection may be determined in consideration of the size of the semiconductor device or power IC and the magnitude of the warp.

Instead of providing the projections 17 in the resin-sealing portion, the lower surface portion of the heat dissipating plate at the locations near the screw receiving notches may be previously projected downwardly.

Figure 5:
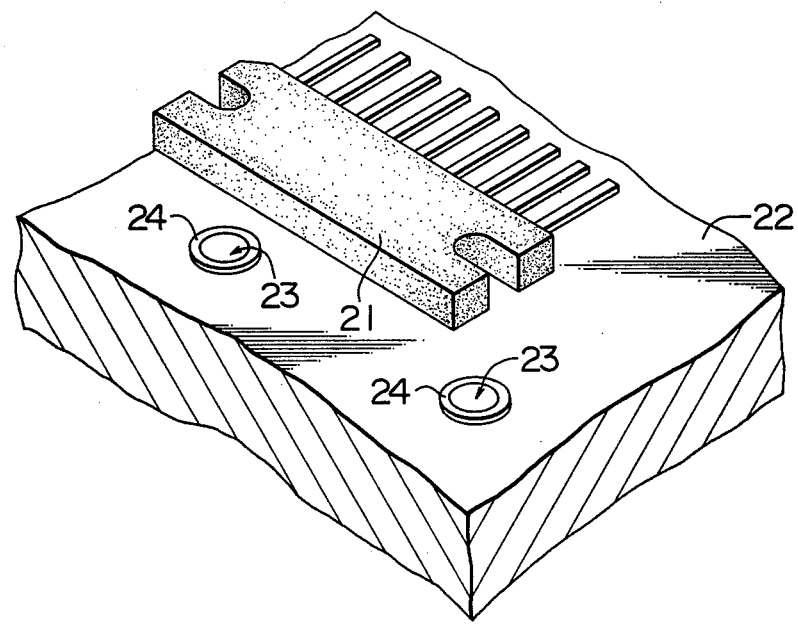
FIG. 5 is a perspective view showing another embodiment of the invention.

Furthermore, instead of providing the projections in the semiconductor device 21, projections 24 may be formed along peripheral edges through-holes 23 of the mounting plate 22, as is shown in FIG. 5.

Additionally, a washer may be employed as the means for preventing the semiconductor element and the resin-sealing portion from being cracked.

Figure 6:
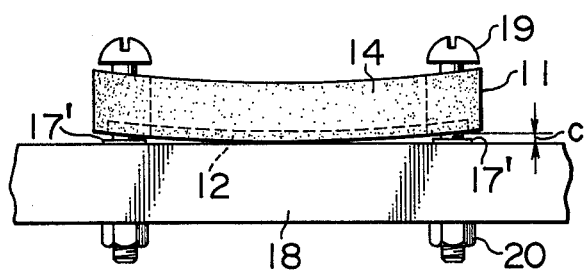
FIG. 6 illustrates an example of a mounting method according to the invention.

FIG. 6 shows an example of the method of mounting the semiconductor device to a mounting panel by using the washers. In the figure, the same reference symbols as those of FIG. 4 denote the same parts as those shown in the latter. Referring to FIG. 6, when the semiconductor device 11 is secured to the mounting plate 18 by means of screws 19 and nuts 20, a washer 17' of 0.1 mm in thickness is disposed between the mounting plate 18 and the semiconductor device with the screws 19 extending therethrough. Accordingly, even if the warp c of the 0.2 mm is present in the semiconductor device 11 as measured at both ends, deformation of the semiconductor device 11 which is brought about by clamping through the screws and nuts in the direction to decrease the warp is limited to a value smaller than 0.1 mm due to the interposition of the washers of 0.1 mm thick. Thus, the deformation of the semiconductor device 11 is reduced as compared with the case of the hitherto known mounting method, whereby the resin-sealing portion 14 as well as semiconductor elements are protected from being cracked.

Because the thickness of the washer is selected smaller than the magnitude of warp, the major portion of the exposed lower surface of the heat dissipating plate 12 will become in close contact with the mounting plate 18, a good thermal conduction is assured from the heat dissipating plate 12 to the mounting plate with a result that no deterioration will occur in the electric characteristics of the semiconductor device. It will be appreciated that better thermal conduction can be attained, as the washer is thinner. For example, in the case of the semiconductor device in which the resin-sealing portion is 10 mm in width, 30 mm in length and 5 mm in thickness, while the thickness of the heat dissipating plate is of 1 to 1.5 mm with the width and the length thereof being equal to those of the resin-sealing portion or slightly smaller than the latter, the washer having the thickness of at least 0.05 mm is effective to prevent the occurrence of cracks in the resin-sealing portion and the semiconductor elements. In practice, the thickness of the washer is selected in dependence on the size of the semiconductor device and the magnitude of warp.

The washer need not be of a doughnut-like or annular configuration. It may be simply in a rectangular form. However, the washers should be located at both ends or sides of the warped semiconductor device. It is not necessarily required that the washer be mounted around the peripheral portion of the screw. However, in view of the fact that the bending moment acting on the semiconductor device at the regions clamped by the screws will become greater, as the washer is distanced from the clamped regions, thereby involving danger of destruction in the semiconductor device, it is desirable that the washer is placed around the periphery of the associated clamping screw.

As will be appreciated from the foregoing, according to the inventive method of mounting the semiconductor device onto a mounting plate, projections are formed or alternatively washers are placed in the vicinity of the screw receiving portions in consideration of the warp caused by the setting contraction of the sealing resin, whereby deformation of the semiconductor device due to the clamping can be reduced and the semiconductor device is protected from any damage or failure. In this manner, failure of the semiconductor device which has heretofore frequently occurred upon the mounting thereof onto a mounting plate as well as the resulted deterioration in the characteristic of the device can be positively prevented in accordance with the invention.

The teaching of the invention as described above can be equally applied to other resin-sealed semiconductor devices and in particular to a high power integrated circuit device of the resin-sealed type which comprises a plurality of external leads extending in parallel from at least a lateral side of a resin block, a thermal conductive plate for heat dissipation projecting from other lateral side of the resin block, and a heat dissipating fin having one end connected to the projecting portion of the thermal conductive plate, the portion of the heat dissipating fin between the one end and the other end extending along the lower surface of the resin block.

Figure 7:
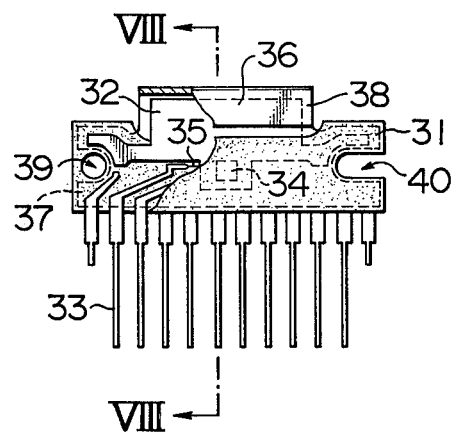
FIG. 7 shows a hitherto known resin-sealed integrated circuit device with a portion broken away.
Figure 8:
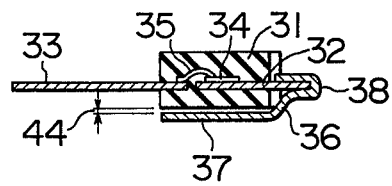
FIG. 8 is a sectional view of the same taken along the line VIII—VIII in FIG. 7.
Figure 9:
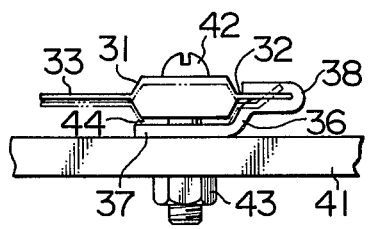
FIG. 9 is a side view of the same as mounted on a mounting plate.
Figure 10:
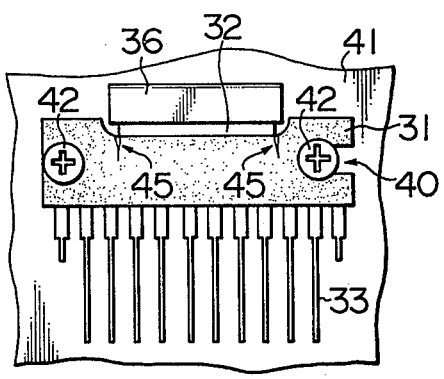
FIG. 10 is a top plate view of the same.

As the above type of semiconductor device, there has been proposed a resin-sealed integrated circuit device of the structure shown in FIG. 7, for example. FIG. 8 shows a section of the device taken along the line VIII—VIII in FIG. 7. As can be seen from these figures, a portion of a thermal conductive plate 32 for heat dissipation protrudes from a lateral side of a resin block 31 which has a plurality of external leads 33 projecting from the opposite lateral side thereof. These external leads 33 and thermal conductive plate are made of the same material having a good thermal conductivity such as oxygen-free copper, tin-added oxygen-free copper, phosphor bronze, Cobal or the like in the form of a sheet strip with surfaces being siliver-plated. As the metal material for use in the high power integrated circuit device, oxygen-free copper and tin-added oxygen-free copper is preferred in consideration of the high thermal conductivity. As integrated circuit element 34 is secured at a portion of the thermal conductive plate 32 which is sealed by the resin block 31. Electrodes of the integrated circuit element 34 and the inner ends of the external leads 33 embedded in the resin block 31 are electrically connected to each other by means of thin wires such as gold wires 35. A heat dissipating fin 36 made of a suitable material such as aluminum sheet is mechanically connected at one end to the projecting portion of the thermal conductive plate 32 so that the thermal conductive portion 37 of the heat dissipating fin 36 between the one end and the other end exends along the lower surface of the resin block 31. The mounting of the heat dissipating fin onto the thermal conductive plate may be carried out in the following manner, for example. The one end portion 38 of the heat dissipating fin 36 is previously bent in a U-shape so that the projecting portion of the thermal conductive plate 32 may be inserted in the U-shape bent portion. After the insertion, the U-shape bent portion is pressed flat by a mechanical caulking means or the like thereby to accomplish the connection. The resin block 31 is formed with a bolt receiving hole 39 and a bolt receiving notch or recess 40 at both ends as viewed in the longitudinal direction. Upon mounting of such semiconductor device of a mounting plate, the thermal conductive portion 37 of the heat dissipating fin 36 is directly contacted to the mounting plate (chassis plate) 41 or mounted through interposition of an electrically insulating member having a high thermal conductivity (not shown), as is shown in FIGS. 9 and 10. The semiconductor device is secured to the plate 41 by means of bolts 42 inserted through the hole 39 or recess 40 in cooperation with associated nuts 43.

It will be appreciated that in such mounting structure as described above, a close contact is only attained with difficulty between the resin block 31 and the thermal conductive portion 37 of the heat dissipating fin 36 and there will accrue a gap 44 on the order of 0.5 mm therebetween, as is shown in FIGS. 8 and 9, because the connection between the heat dissipating fin 36 and the thermal conductive plate 32 is so carried out that only the one end portion 38 of the fin 36 is connected to the projecting portion of the thermal conductive plate 32. Further, the thermal conductive plate 32 is arranged to extend from the mid portion of the lateral side of the resin block 31. Because of such arrangement, when the semiconductor device is clamped by the bolts 42, both side portions of the resin block 31 tend to contact closely with the thermal conductive portion 37 against the resilient force of the heat dissipating fin 36. On the other hand, the thermal conductive plate 32 extending in the resin block 31 is constantly subjected to a force acting in the upward direction due to the restoring tendency or force. As a result, shearing force will be applied to the resin portion located along the peripheral portion of the thermal conductive plate 32 embedeed in the resin block 31. In other words, since the portion of resin block lying over the thermal conductive plate 32 tends to be pushed upwardly, shearing force is applied to the interface portion between the peripheral portion of the thermal conductive plate 32 and the above resin block portion, wich often result in cracks 45 produced in the resin block (FIG. 10) to deteriorate the moisture-resistance of the integrated circuit device. Besides, when the gap 44 is large, deformation (bending) of the resin block 31 will be correspondingly increased and eventually involve undesirable cracking even in the circuit element.

Figure 11:
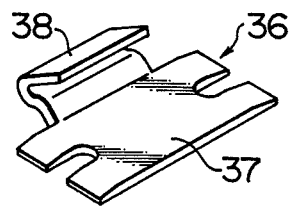
FIG. 11 is a perspective view showing a heat dissipating fin prior to the incorporation into a resin-sealed semiconductor device.
Figure 12:
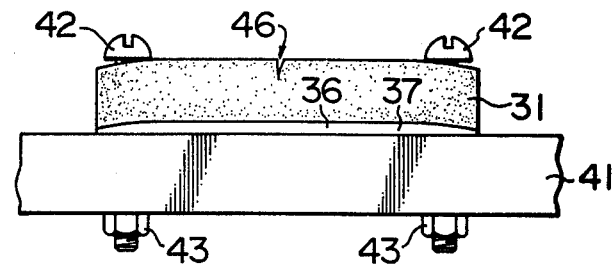
FIG. 12 is a front view showing a resin-sealed semiconductor device in the state mounted on a mounting panel.

The heat dissipating fin is usually formed from an aluminum sheet by using a punching press. In such case, the peripheral portion of the heat dissipating fin is likely to be formed thinner than the remaining portion because aluminum is a relatively soft material. Particularly, narrow portions of the thermal conductive region 37 will become remarkably thinner, as is illustrated in FIG. 11. Under such circumstances, when the integrated circuit device is to be secured to a mounting plate 41 by means of bolts 42 and nuts 43 as is shown in FIG. 12, tensile stress is produced in the resin mass in the radial direction, whereby crack 46 is produced. In case epoxy resin is used as sealant, cracks are produced when the tensile stress increases beyond the tensile strength strain of $4000 \times 10^6$.

Additionally, the portions of the heat dissipating fin where the clamping force is applied will often undergo deformation to become thinner, when the clamping force is excessively high. As a result, tensile stress is produced in the resin block 31 in the direction from the center portion toward the peripheral portion (radial direction), involving cracks in the resin block as well as the IC element embedded therein.

In order to avoid the above disadvantages, it is necessary that means are provided to prevent mechanical stresses from being applied to the resin block and the IC element when the resin-sealed semiconductor IC device is secured onto the mounting plate.

Figure 13:
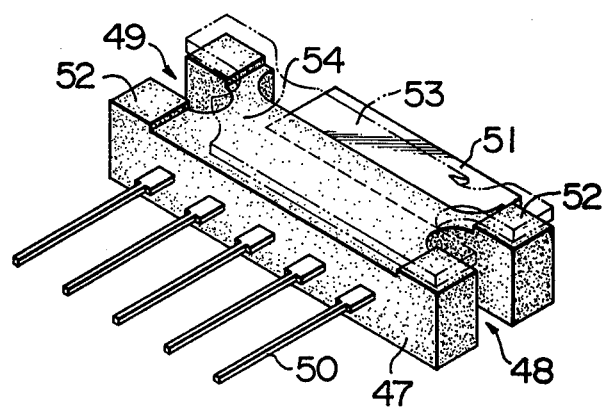
FIG. 13 is a perspective view showing another embodiment of the resin-sealed semiconductor device according to the invention with the heat dissipating fin being removed for the sake of clarification of illustration.

FIG. 13 shows a high power IC device according to an embodiment of the invention with a heat dissipating fin being removed. Reference numeral 47 denotes a sealing resin block made of epoxy resin, for example and formed with bolt receiving recesses or notches 48 and 49. A plurality of external leads to extend from one lateral side of the resin block in parallel to one another and a thermal conductive plate 51 extends from the opposite lateral side of the resin block 47. Seat portions 52 each projected 0.1 to 0.5 mm in height are formed in the lower surface of the resin block 47 at the lateral sides of the bolt receiving recesses 48 and 49. It is to be noted that the semiconductor device is shown from below in FIG. 13, i.e. the surface destined to bear on the mounting plate faces upwardly. A heat dissipating plate 53 of aluminum (indicated by broken lines) has one end portion connected to the thermal conductive plate 51 through a mechanical clamping or caulking and the other end portion 54 extending along the lower surface of the resin block 47 in which the seat portions 52 are formed. The height of the seat portions 52 are previously determined in dependence on the dimension of gap formed between the heat dissipating fin 36 and the resin block 47 upon mounting of the fin through the mechanical caulking. The projecting height is selected so as to be substantially equal to the size of the gap.

Figure 14A:
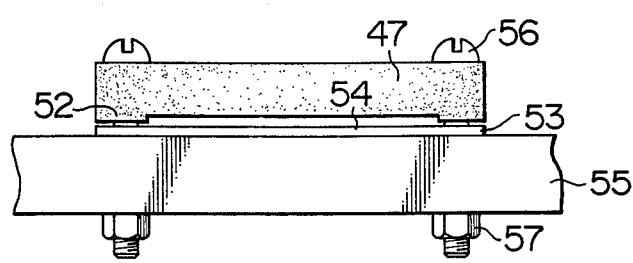
FIGS. 14a and 14b show the same as mounted on a mounting panel.
Figure 14B:
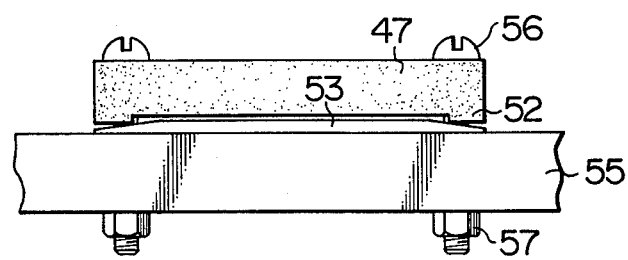

FIGS. 14a and 14b show a manner in which the IC device is installed on the mounting plate 55. As is shown in FIG. 14a, even when gap of about 0.5 mm is produced between the mid portion of the resin block 47 and the thermal conductive plate 54 due to the connection through the mechanical clamping or caulking, the seat portions 52 are brought into contact with the thermal conductive portion 54 of the heat dissipating fin 53 in a heat transfer manner with a slight deformation of the resin block 47 upon securing the IC device through the bolts 56 and 57, since the seat portions 52 of 0.4 to 0.5 mm in height are formed adjacent to the bolt receiving receves at both ends of the resin block 47. Accordingly, tensile stress or shearing stress of a great magnitude will not be produced in the surface portion of the resin block and at the interface region between the thermal conductive plate 51 connected to the heat dissipating fin 53 and the resin block 47. Thus, the resin block 47 as well as semiconductor element embedded therein can be protected from any damage or failure.

Further, even if the end portions of the heat dissipating fin 53 are formed thin or become thin due to the clamping force exerted by the bolts 56, the resin block 47 is pressed relative to the center portion of the heat dissipating fin 53 without incurring any bending in the resin block to cause failue upon mounting of the IC device on the plate because a gap exists between the center portions of the fin 53 and the resin block 47, as is illustrated in FIG. 14b.

As will be appreciated from the foregoing description, no failure will occur in the resin block or in the semiconductor element when the IC device is mounted in accordance with the teaching of the invention due to such arrangement that a gap is produced between the center surface portions of the resin block and the heat dissipating fin while the close contacts can be attained in the areas adjacent to the clamping bolts. The device is not subjected to any deterioration in respect of the electric characteristics thereof.

According to additional aspect of the invention, the peripheral portions of the bolt receiving recesses of the heat dissipating fin may be formed with an increased thickness corresponding to the gap produced by the mechanical caulking or clamping. The IC device is then required to be assembled so that the surface formed with the offset portions will face the resin block.

Figure 15:
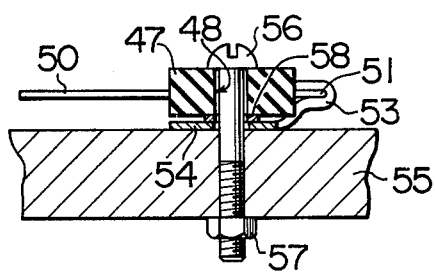
FIG. 15 is a sectional view showing still another embodiment of the invention.

As an alternative, a washer 58 of the thickness corresponding to the gap produced between the fin 53 and the resin block 47 by the mechanical clamping may be inserted and fixedly secured by an adhesive, if necessary, as is shown in FIG. 15.

Excessively large thickness of the seat portions formed in the resin block, projections formed in the fin or the washer as compared to the gap size formed between the fin and the resin block through the mechanical clamping connection is not preferred because the surface portion of the resin block at the side of the heat dissipating fin is damaged under compressing force upon the clamping and/or the resin block is inclined. On the contrary, excessively small thickness in turn will provide an obstacle to accomplishing the intended purpose, involving failure in the resin block and the semiconductor element due to the tensile stress and the bending force. Thus, the seat portions having a thickness substantially the same as the gap is desired.

It will now be understood that the semiconductor devices of the resin-sealed type according to the invention is protected from any failue of the resin block and the semiconductor elements caused by unnecessary force upon securing the device onto a mounting panel or plate, involving no deterioration in the characteristics of the device.

We claim:

1. A semiconductor device, comprising:
   a. a sealing resin body,
   b. a heat dissipating plate provided on the lower surface of said resin body and having a smaller thermal expansion coefficient that that of said resin body,
   c. a mounting plate for mounting said heat dissipating plate at both ends of said sealing resin body,
   d. recesses formed through said sealing resin body and said heat dissipating plate at both ends of said sealing resin body,
   e. bolt means inserted through said recesses for securing said heat dissipating plate onto said mounting plate, and
   f. protrusions formed at least in the peripheral portions of said recesses.

2. A semiconductor device according to claim 1, wherein said protrusions are formed integrally with said sealing resin body.

3. A semiconductor device according to claim 1, wherein said protrusions are formed integrally with said heat dissipating plate.

4. A semiconductor device according to claim 1, wherein said protrusions are formed integrally with said mounting plate.

5. A semiconductor device according to claim 1, wherein said protrusion are composed of discrete plate-like members which are independent of said sealing resin body and said heat dissipating plate.

6. A semiconductor device according to claim 5, wherein said plate-like member is a doughnut-like washer.

7. A semiconductor device according to claim 5, wherein said plate-like member is a rectangular washer.

8. A method of mounting a semiconductor device having a heat dissipating metal plate provided on a lower surface of a resin-sealing portion onto a mounting plate by means of screws inserted through recesses formed in said resin-sealing portion at both ends thereof, wherein protrusions are previously formed at least along peripheral portions of said recesses.

9. A method according to claim 8, wherein said protrusions are formed integrally with said resin-sealing portion.

10. A method according to claim 8, wherein said protrusions are formed integrally with said heat dissipating plate.

11. A method according to claim 8, wherein said protrusions are formed integrally with said mounting plate.

12. A method according to claim 8, wherein each of said protrusions is composed of a plate-like member interposed between said semiconductor device and said mounting plate.

13. A semiconductor device of a resin-sealed type, comprising a sealing resin body, a plurality of external leads extending in parallel to one another from at least one lateral side of said resin body, a thermal conductive plate for heat dissipation projecting from a lateral side of said resin body, a heat dissipating fin having one end connected to said thermal conductive plate and the other end portion extending along a lower surface of said resin body, and bolt receiving recesses formed through said resin body and said heat dissipating fin at both ends of said semiconductor device, wherein said heat dissipating fin is kept in close contact with said resin body in the vicinity of said recesses and a gap is provided which has a size to inhibit mutual contact between said heat dissipating fin and said resin body at regions extending between said bolt receiving recesses.

14. A semiconductor device according to claim 13, wherein lower surface portions of said resin body where said bolt receiving recesses are formed are protruded partially toward said heat dissipating fin in order to form a gap.

15. A semiconductor device according to claim 13, wherein the upper surface portions of said heat dissipating fin where said bolt receiving recesses are formed are protruded partially toward said resin body in order to form said gap.

16. A semiconductor device according to claim 13, wherein plate-like members are inserted between said heat dissipating plate and said resin body at locations where said bolt receiving recesses are formed in order to obtain said gap.

* * * * *